United States Patent
Alberti et al.

(10) Patent No.: US 8,149,387 B2
(45) Date of Patent: *Apr. 3, 2012

(54) METHOD OF PLACING A SUBSTRATE, METHOD OF TRANSFERRING A SUBSTRATE, SUPPORT SYSTEM AND LITHOGRAPHIC PROJECTION APPARATUS

(75) Inventors: Jozef Augustinus Maria Alberti, Nederweert (NL); Gerardus Petrus Matthijs Van Nunen, Berghem (NL); Frans Erik Groensmit, Helmond (NL); Rene Theodorus Petrus Compen, Valkenswaard (NL); Abraham Alexander Soethoudt, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 336 days.

This patent is subject to a terminal disclaimer.

(21) Appl. No.: 12/248,586

(22) Filed: Oct. 9, 2008

(65) Prior Publication Data
US 2009/0180095 A1 Jul. 16, 2009

Related U.S. Application Data

(60) Provisional application No. 60/960,699, filed on Oct. 10, 2007.

(51) Int. Cl.
*G03B 27/58* (2006.01)
*G03B 27/62* (2006.01)

(52) U.S. Cl. ............................ 355/72; 355/75
(58) Field of Classification Search ............ 355/53, 355/72–76; 378/34, 35
See application file for complete search history.

(56) References Cited

U.S. PATENT DOCUMENTS

| | | | |
|---|---|---|---|
| 6,707,528 B1 * | 3/2004 | Aoyama et al. | 355/18 |
| 6,795,164 B2 | 9/2004 | Hoogenraad et al. | |
| 6,860,533 B2 | 3/2005 | Lee et al. | |
| 7,110,085 B2 | 9/2006 | Zaal et al. | |
| 7,139,638 B2 | 11/2006 | Nakajima et al. | |
| 7,374,957 B2 | 5/2008 | Oesterholt | |
| 7,564,536 B2 * | 7/2009 | Ottens et al. | 355/72 |
| 7,583,357 B2 | 9/2009 | Donders et al. | |
| 7,706,907 B2 * | 4/2010 | Hiroki | 700/114 |
| 2006/0010710 A1 * | 1/2006 | Park et al. | 34/423 |
| 2009/0153816 A1 * | 6/2009 | Alberti et al. | 355/52 |

(Continued)

FOREIGN PATENT DOCUMENTS
CN 1550912 A 12/2004
(Continued)

OTHER PUBLICATIONS
English Language Abstract for CN 1550912 A, published Dec. 1, 2004, 1 page.
(Continued)

*Primary Examiner* — Hung Henry Nguyen
(74) *Attorney, Agent, or Firm* — Sterne, Kessler, Goldstein & Fox P.L.L.C.

(57) ABSTRACT

A method is provided for placing a substrate onto a surface of a substrate holder, the surface having a plurality of burls. First substrate placement data is calculated. This data enables placement of the substrate at a certain position with respect to a position of the plurality of burls on the surface of the substrate holder. Then, the substrate is placed at the certain position in accordance with the substrate placement data. The certain position may be based on the position at which placement would result in a minimized overlay error or may be based on the position at which placement would result in minimized substrate deformation.

13 Claims, 11 Drawing Sheets

U.S. PATENT DOCUMENTS

2010/0265488 A1  10/2010  Alberti et al.

FOREIGN PATENT DOCUMENTS

| | | |
|---|---|---|
| JP | 11-330206 A | 11/1999 |
| JP | 2001-127144 A | 5/2001 |
| JP | 2003-152053 A | 5/2003 |
| JP | 2003-168719 A | 6/2003 |
| JP | 2006-140498 A | 6/2006 |
| JP | 2007-027718 A | 2/2007 |

OTHER PUBLICATIONS

English Language Translation of Chinese Office Action issued on Oct. 12, 2010, directed to related CN Application No. 200810191102.0 from State Intellectual Property Office of People's Republic of China, Beijing, China; 2 pages.

Office Action mailed on Jan. 25, 2011 for U.S. Appl. No. 12/248,284, filed Oct. 9, 2008; 7 pages.

Notice of Allowance mailed on Apr. 14, 2011, directed to co-pending U.S. Appl. No. 12/248,284, filed Oct. 9, 2008; 7 pages.

Notice of Allowance directed to co-pending U.S. Appl. No. 12/248,284, filed Oct. 9, 2008, mailed Jul. 21, 2011; 9 pages.

Non-Final Rejection mailed Jul. 25, 2011, directed to co-pending U.S. Appl. No. 12/784,763, filed May 21, 2010; 10 pages.

English language Abstract of Japanese Patent Publication No. 11-330206 A, published Nov. 30, 1999; 1 page.

English language Abstract of Japanese Patent Publication No. 2001-127144 A, published May 11, 2001; 1 page.

English language Abstract of Japanese Patent Publication No. 2003-152053 A, published May 23, 2003; 1 page.

English language Abstract of Japanese Patent Publication No. 2003-168719 A, published Jun. 13, 2003; 1 page.

English language Abstract of Japanese Patent Publication No. 2006-140498 A, published Jun. 1, 2006; 1 page.

English language Abstract of Japanese Patent Publication No. 2007-027718 A, published Feb. 1, 2007; 1 page.

English translation of Japanese Notice of Reasons for Rejection directed to related Japanese Application No. 2008-262677, the Japanese Patent Office, mailed May 30, 2011; 3 pages.

English translation of Japanese Notice of Reasons for Rejection directed to related Japanese Application No. 2008-264460, the Japanese Patent Office, mailed May 30, 2011; 4 pages.

Final Rejection mailed Dec. 16, 2011 for U.S. Appl. No. 12/784,763, filed May 21, 2010; 9 pages.

\* cited by examiner

METHOD OF PLACING A SUBSTRATE, METHOD OF TRANSFERRING A SUBSTRATE, SUPPORT SYSTEM AND LITHOGRAPHIC PROJECTION APPARATUS

CROSS-REFERENCE TO RELATED APPLICATION

This application claims the benefit of the filing date of U.S. Provisional Application 60/960,699 filed on Oct. 10, 2007. The subject matter of that application is incorporated herein by reference as if fully set forth herein.

BACKGROUND OF THE INVENTION

1. Field of Invention

The inventions relate in general to placing a substrate onto a surface of a substrate holder. They further relate to transferring a substrate from a first substrate holder to a second substrate holder using a transfer unit. The inventions further relate to a support system for supporting a substrate, a lithographic apparatus comprising such a support system and device manufacturing using such a lithographic apparatus.

2. Related Art

A lithographic apparatus applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

When devices are manufactured using lithographic apparatus, an important factor in the yield, i.e. the percentage of correctly manufactured devices, which is a function of the accuracy with which layers are printed in relation to layers that have previously been formed. Poor accuracy results in overlay. An overlay error budget will often be 10 nm or less. To achieve such accuracy, the substrate should be aligned to the mask pattern so as to be transferred with great accuracy.

In order to achieve good image definition and layer overlay the irradiated surface of a substrate should be positioned accurately on supporting surface, i.e. a substrate holder, and be kept on the substrate holder as flat and as stationary as possible during exposure. Generally, for this purpose, the substrate holder is provided with a plate comprising a plurality of protrusions, also referred to as burls. On such a substrate holder, a substrate can be placed so that its backside is in contact with the burls, all of which lie in a well-defined plane. By connecting aperture(s) in the substrate holder to a vacuum generating device, the backside of the substrate can be clamped securely against the burls. The use of burls in this manner ensures that only a fraction of the area of the backside is actually pressed against a solid surface; in this way, the distorting effect of any particulate contamination on the backside of the wafer is minimized, since such contamination will most probably be situated in the empty spaces between burls rather than being pressed against the top surface of a burl.

However, if the substrate is fixed to the substrate holder as described above, the substrate will bend over the burls. As a result, an image being exposed on the substrate will shift locally. When the substrate after development is again positioned on the substrate holder for a second exposure, due to a different position with respect to protrusions, the local image shift will be different during the second exposure than during the first exposure. Consequently, an overlay error has been introduced.

With the continual desire to image ever smaller patterns to create device with higher component densities, there is pressure to reduce overlay errors, which leads to a desire for improved placement of a substrate on a substrate holder provided with burls.

SUMMARY

It is therefore useful and desirable to provide methods and arrangements for placing a substrate and transferring a substrate and to provide a transfer system with an improved placement accuracy than hitherto known. To that end, embodiments in accordance with the invention provide methods of placing a substrate onto a surface of a substrate holder, the surface being provided with a plurality of burls, the method including acquiring a position of the plurality of burls, determining substrate placement data for enabling placement of the substrate at a certain position with respect to a position of the plurality of burls on the surface of the substrate holder, and placing the substrate at the certain position in accordance with the substrate placement data.

In an embodiment, there is provided a computer readable medium comprising computer executable code, which, when loaded on a computer assembly, enables the computer assembly to control a method as described above.

In another embodiment, there is provided a method of transferring a substrate from a first substrate holder to a second substrate holder by means of a transfer unit on the basis of transfer data available thereto, the second substrate holder comprising a surface provided with a plurality of burls, the method including providing the substrate on the first substrate holder, transferring the substrate by means of the transfer unit in accordance with the transfer data from the first substrate holder to a certain position with respect to the plurality of burls on the second substrate holder, and placing the substrate at the certain position on the second substrate holder, wherein the placing is performed according to the method of placing a substrate onto a surface of a substrate holder as described above.

In an embodiment the method comprises acquiring a position the plurality of burls on the substrate holders.

In an embodiment, there is provided a computer readable medium comprising computer executable code, which, when loaded on a computer assembly, enables the computer assembly to control a method of transferring as described above.

In another embodiment, there is provided a support system for supporting a substrate, the support system including a substrate holder configured to hold the substrate, the substrate holder comprising a surface provided with a plurality of burls, a substrate handling device configured to place a substrate on the substrate holder in accordance with substrate placement data, a measurement unit configured to perform measurement useable for determining a position of the plurality of burls provided on the surface of the substrate holder, a processor configured to determine substrate placement data, the substrate placement data enabling placement of the substrate on the surface of the substrate holder at a certain position with respect to the position of the plurality of burls.

Additionally, in an embodiment, there is provided a lithographic projection apparatus including an illumination system configured to provide a beam of radiation, a support structure configured to support a patterning device that serves to impart the beam of radiation with a pattern in its cross-section, a support system for supporting a substrate as described above, and a projection system configured to expose the patterned beam on the substrate.

In an embodiment, there is provided a device manufacturing method comprising projecting a patterned beam of radiation onto a substrate using a lithographic projection apparatus as described above.

In an embodiment, there is provided a computer readable medium comprising computer executable code, which, when loaded on a computer assembly, enables the computer assembly to control a device manufacturing method as described above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
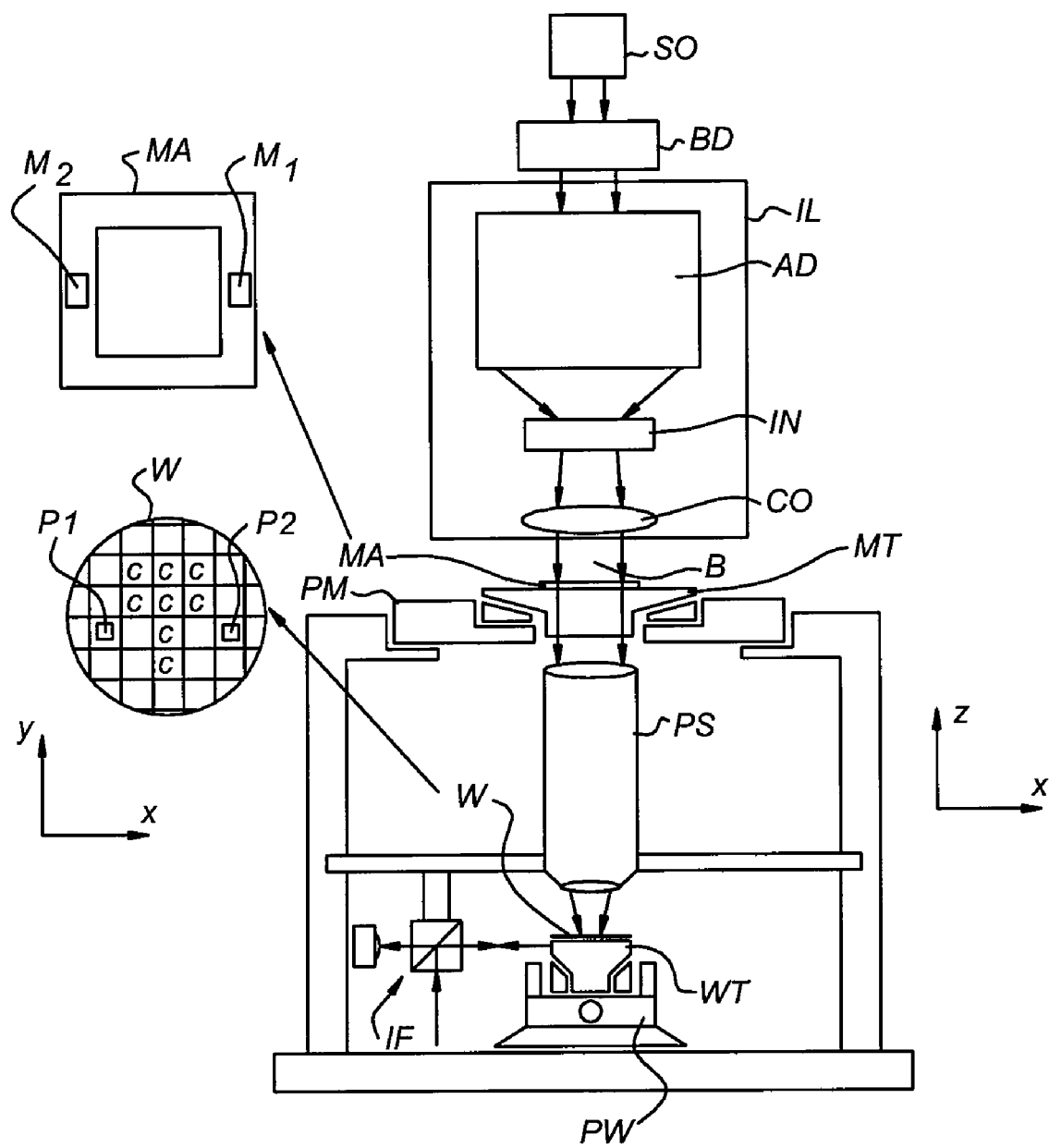
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV-radiation).

a support structure (e.g. a mask table) MT constructed to support a patterning device (e.g. a mask) MA and connected to a first positioner PM configured to accurately position the patterning device in accordance with certain parameters;

a substrate holder, e.g. a substrate table (e.g. a wafer table) WT, constructed to hold a substrate (e.g. a resist coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Iluminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if desirable or required, may be referred to as a radiation system.

The illuminator IL may comprise an adjuster AD for adjusting the angular intensity distribution of the radiation beam. Generally, at least the outer and/or inner radial extent (commonly referred to as □-outer and □-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as desirable or required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
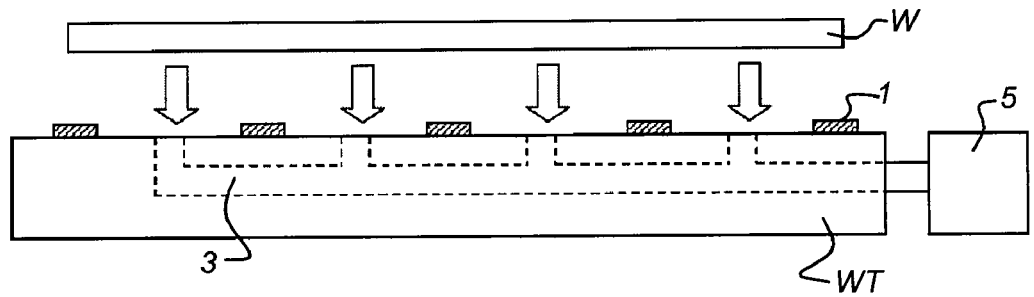
FIGS. 2a-2c schematically depict placement of a substrate on a substrate holder as known in the art.
Figure 2B:
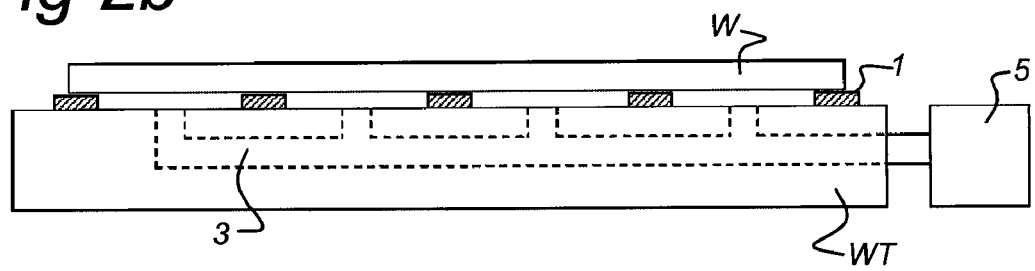
Figure 2C:
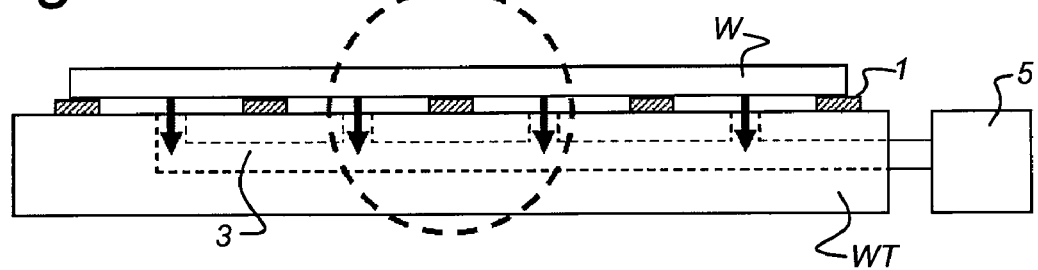

FIGS. 2a-2c schematically depict placement of a substrate on a substrate holder like substrate table WT as known in the art. The substrate table WT is provided with a plurality of protrusions 1, also referred to as pimples or burls. In this document, the expression burl will be primarily used, but the two should be understood to be interchangeable herein. Generally at the edge of the wafer there is a so-called vacuum seal. In lithographic apparatus employing EUV, there will generally be electric static clamping. Many embodiments of the invention are not limited to vacuum systems, but are also applicable on electrostatic clamps.

As is shown in FIG. 2a, the substrate W is moved towards the substrate table WT until the substrate makes contact with the plurality of burls provided on the surface of the substrate table WT.

The substrate W now rests on the substrate table WT, its backside being in contact with the plurality of burls 1 on the surface of the substrate table WT, a situation which is schematically depicted in FIG. 2b.

At this stage, air may be sucked away from spaces between the plurality of burls by connecting apertures 3 in the substrate table WT to a vacuum generating device 5. The suction of air is schematically depicted in FIG. 2c by the arrows.

Figure 2D:
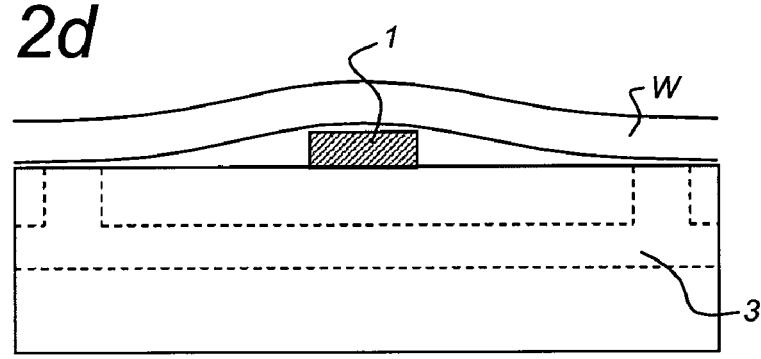
FIG. 2d schematically depicts a detail of a substrate placed on a substrate holder as shown in FIG. 2c.

FIG. 2d schematically depicts a detail, i.e., shown in the dashed circle of FIG. 2c, of a substrate W placed on a substrate table WT. Due to the vacuum between the substrate W and the substrate table WT, and the uneven surface of the substrate table WT due to the plurality of burls 1, the substrate W is locally deformed. As a result, an image being exposed on the substrate W will shift locally with respect to the desired image. When the substrate W after development is again positioned on the substrate table WT for a second exposure, due to a different position with respect to the plurality of burls 1, the local image shift will be different during the second exposure than during the first exposure. Consequently, an overlay error has been introduced.

Figure 3:
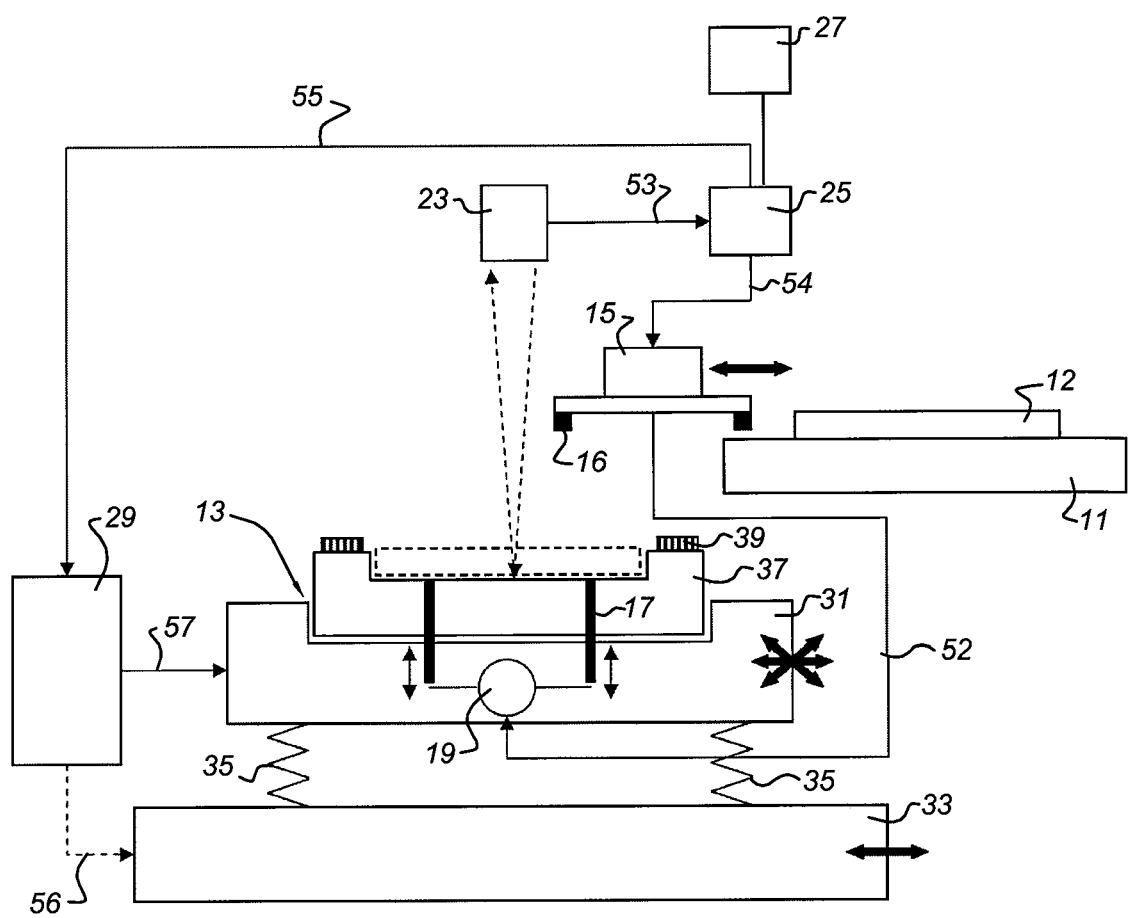
FIG. 3 schematically depicts a transfer system that may be used in embodiments of the invention.

FIG. 3 schematically depicts a transfer system that may be used in embodiments of the invention. The transfer system depicted in FIG. 3 is suitable for use in a lithographic projection apparatus. It is configured to transfer a substrate on the basis of transfer data available thereto. The transfer system comprises a first substrate holder 11, a second substrate holder 13, and a transfer unit 15.

The first substrate holder 11 is configured to hold a substrate 12. In an embodiment, the first substrate holder 11 is rotatable around its center, i.e., the center of the surface on which the substrate can be held. Therefore, an axis of rotation is substantially perpendicular to aforementioned surface.

The second substrate holder 13 is also configured to hold the substrate 12 on a surface thereof. The aforementioned surface of the second substrate holder 13 is provided with a plurality of burls. A position of the plurality of burls can be acquired. In an embodiment acquiring the position of the plurality of burls comprises positions of at least four burls. Acquiring the position can comprise a calibration, in particular a relative position with respect to a fixed part, e.g. a part of the substrate table.

If the transfer system is used in a lithographic projection apparatus, the second substrate holder 13 may correspond to the substrate table WT and the substrate 12 to be held may correspond to substrate W. Furthermore, the first substrate holder 11 may correspond to a substrate table used in a pre-alignment unit.

The transfer unit 15 is configured to transfer the substrate 12 from the first substrate holder 11 to the second substrate holder 13. The transfer is executed in accordance with aforementioned transfer data. In the embodiment schematically depicted in FIG. 3, the transfer unit 15 comprises two sub-units, i.e., a gripper unit 16 configured to pick up the substrate 12 from the first substrate holder 11 and move the substrate 12 towards the second substrate holder 13, and three or more extendable pins residing in the second substrate holder 13, so-called E-pins 17. The position and movement of the E-pins 17 may be controlled by an E-pins actuator 19, e.g., a Lorentz motor, which in turn may be controlled by local electronics. As a safety measure on power failure occurrences, the E-pins 17 may be configured to fall to their lowest position by the natural force of gravity. This may ensure that the E-pins 17 are not to be damaged. The transfer unit 15 may now be arranged to control movement of the substrate 12 held by the gripper unit 16 in cooperation with movement of the E-pins 17, schematically depicted by means of arrowed lines 51 and 52, respectively. The transfer unit 15 may control movement of the gripper unit 16 in a direction towards the E-pins 17, in FIG. 3 a movement to the left, such that the substrate 12 is positioned suitably above the E-pins 17. The transfer unit 15 may then control extension of the E-pins 17 towards the substrate 12, in FIG. 3 upwards, until they make contact with the substrate 12. The transfer unit 15 subsequently controls detachment of the substrate 12 from the gripper unit 16 and subsequent movement of the gripper unit 16 away from the E-pins 17, e.g., in FIG. 3 a movement to the right until the gripper unit 16 no longer blocks a movement of the substrate 12 towards the second substrate holder 13. Finally, the transfer unit 15 may control retraction of the E-pins 17 until the substrate 12 is positioned on the second substrate holder 13.

The transfer system further comprises a measuring unit 23, e.g. an imaging apparatus like a (CCD)-camera or the like or a measurement sensor. In case the measuring unit 23 is an imaging apparatus, the measuring unit 23 may be configured to acquire an image of the plurality of burls on the surface of the second substrate holder 13. In case the measuring unit 23 is a measurement sensor, a position of each burl of the plurality of burls on the second substrate holder 13 may be measured. Alternatively or additionally, measurement unit 23 may be configured to measure the position of marks provided on the substrate 12 or the position of marks provided on the second substrate holder 13.

The transfer system further comprises a processor 25. In embodiments of the invention, the processor 25 is configured to calculate substrate placement data for enabling placement of the substrate 12 at an optimal position with respect to the position of the plurality of burls on the second substrate holder 13. In a transfer system as shown in FIG. 3, the processor 25 is configured to transmit aforementioned substrate placement data to the transfer unit 15 in order to enable the transfer unit 15 to control placement of the substrate in accordance with the substrate placement data.

In an embodiment, the processor 25 is connected to the measurement unit 23 so that they can communicate. This communication is represented by an arrowed line 53. Processor 25 uses information received from the measuring unit 23 to calculate the substrate placement data. Additionally, the processor 25 may be in communication with a memory 27. Information stored in a memory 27 may be used by the processor 25 for the calculation of aforementioned substrate placement data. More details with respect to the functionality of the processor 25 are described with reference to FIGS. 4-6 and 8.

Movement of the second substrate holder 13 may be controlled by a control unit 29, which in its turn is connected for communication to the processor 25 or the transfer unit 15 in case accurate placement of the substrate in view of the substrate placement data movement of the second substrate holder 15 is desirable or required. A data stream between the processor 25 and the control unit 29 is in FIG. 3 schematically depicted by an arrowed line 55. Control by processor 25 of substrate holder 15 is represented by an arrowed line 54.

It should be understood that, although in FIG. 3 the processor 25, the transfer unit 15, and the control unit 29 are depicted as separate elements, the processor 25 may be incorporated in one of the transfer unit 15 and the control unit 29, e.g. in case the control unit 29 takes the form of a computer assembly as described with reference to FIG. 9.

Positioning of a substrate table WT in a lithographic projection apparatus is generally implemented by a so-called long-stroke stage module and a so-called short-stroke stage module, in FIG. 3 indicated by reference number 31 and 33 respectively. The combined positioning ability of theses two stage modules 31, 33 provides an accurate and fast positioning. The long-stroke stage module 33 generally provides coarse positioning and movement of the short-stroke stage module 31 in a number of directions, generally three. The short-stroke stage module 31 generally provides accurate movement and positioning of a substrate W placed thereon in six degrees of freedom. The short-stroke stage module 31 may be separated from the long-stroke stage module 33 by means of air bearings 35 and may be driven by one or more Lorentz motors (not shown).

The control unit 29 may comprise separate control modules to control movement and positioning of the short-stroke stage module 29 and the long-stroke stage module 33 separately. Alternatively, the same control unit 29 may be configured to control movement and positioning of both the long-stroke stage module 31 and the short-stroke stage module 33, this situation being depicted in FIG. 3 by arrowed lines 56 and 57, respectively.

As schematically depicted in FIG. 3, the second substrate holder 13 may not only comprise a short-stroke stage module 31, but also an additional element 37. The additional element 37 may be provided with a recess area sufficiently large to accommodate the substrate 12. The surface of the recess is then provided with aforementioned plurality of burls and further provided with apertures between the plurality of burls for the purpose of establishing a vacuum environment as discussed with reference to FIGS. 2*a*-*d*. In immersion lithographic projection apparatus, the recess in the additional element 37 may also have the purpose of containing and controlling immersion fluid.

Furthermore, the second substrate holder 13 may be provided with one or more marks 39.

In embodiments of the method of placing a substrate onto a surface of a substrate holder which surface is provided with a plurality of burls, the method comprises determining substrate placement data and placing the substrate in accordance with the substrate placement data. The substrate placement data enable placement of the substrate at a certain position with respect to the position of the plurality of burls on the surface of the substrate holder, i.e. the position of the plurality of burls as a whole and the position and orientation of the plurality of burls with respect to each other. The certain position relates to an optimal position that may be determined with respect to several different criteria.

First, the optimal position may relate to an optimal position with respect to overlay, i.e. a position which results in the smallest overlay error is recognized as the optimal position. In other words, consider a situation in which a first exposure of a substrate in a lithographic apparatus has taken place at a certain position with respect to a plurality of burls arranged in a certain pattern on a surface of a substrate holder, e.g., the second substrate holder as schematically depicted in FIG. 3. Then, in case the same substrate holder is used for a subsequent, second exposure in the lithographic apparatus, the optimal position of the substrate corresponds exactly with the position the substrate had during the first exposure. However, in case a different substrate holder, i.e., a third substrate holder, for example a different substrate holder in the same lithographic apparatus or a similar substrate holder in a different lithographic apparatus, is used for a subsequent, second exposure in a lithographic apparatus, the situation may be different. In case the third substrate holder comprises a surface provided with a plurality of burls similarly arranged as in the substrate holder, e.g., the second substrate holder, used for the first exposure, the optimal position of the substrate is a position in which the substrate is positioned with respect to the plurality of burls in a similar way as during the first exposure. In case the arrangement of the plurality of burls differs per substrate holder, more difficult calculations come into play to calculate optimum positioning for best overlay results, e.g., calculations in which a prediction how substrate deformation on the particular arrangement of the plurality of burls at hand will be taken into account.

Secondly, the optimal position may relate to deformation. As described with reference to FIG. 2*d*, due to the creation of a vacuum in a space between the plurality of burls, the substrate is locally deformed, which results in local exposure errors if the substrate is exposed in a lithographic apparatus while being in such a condition. The optimal position may relate to a position in which the local deformations are minimized. In an embodiment, minimization of the local deformations corresponds with determining the least square or a 99.7% interval and selecting a position in which the least square is minimized or 99.7% is optimized respectively. Alternatively, it may mean that the position is selected in which the average local deformation is lowest. In another embodiment, minimization of the local deformation may mean that at positions where most critical features are to be patterned, the local deformations are smallest, which may mean that local deformations at other positions on the substrate are higher than average.

Finally, the optimal position may be predetermined, i.e. a substrate placement position is stored in a memory in a computer assembly in communication with one or more lithographic projection apparatus, also referred to as "matched machines". Each substrate to be processed one of these matched machines needs to be placed at that predetermined position on its respective substrate holder. The substrate placement data are then determined to establish aforementioned placement.

Of course, the optimal position may also relate to both overlay and deformation as both are closely related. After all, consider again the situation in which a substrate is exposed while being placed on a surface of a certain substrate holder in a lithographic apparatus, the surface being provided with a plurality of burls arranged in a certain pattern. Then, an optimal position for the substrate in a subsequent exposure, while the substrate is placed on surface of a different substrate holder in a lithographic apparatus, the surface being provided with a plurality of burls arranged in a similar pattern as before, may be different with respect to the plurality of burls as compared to the first exposure. This may be the case when the plurality of burls provided on the surface of the substrate holder used in the first exposure differs with respect to form and/or size as compared to the plurality of burls provided on the surface of the substrate holder used in the subsequent, second exposure.

Figure 4:
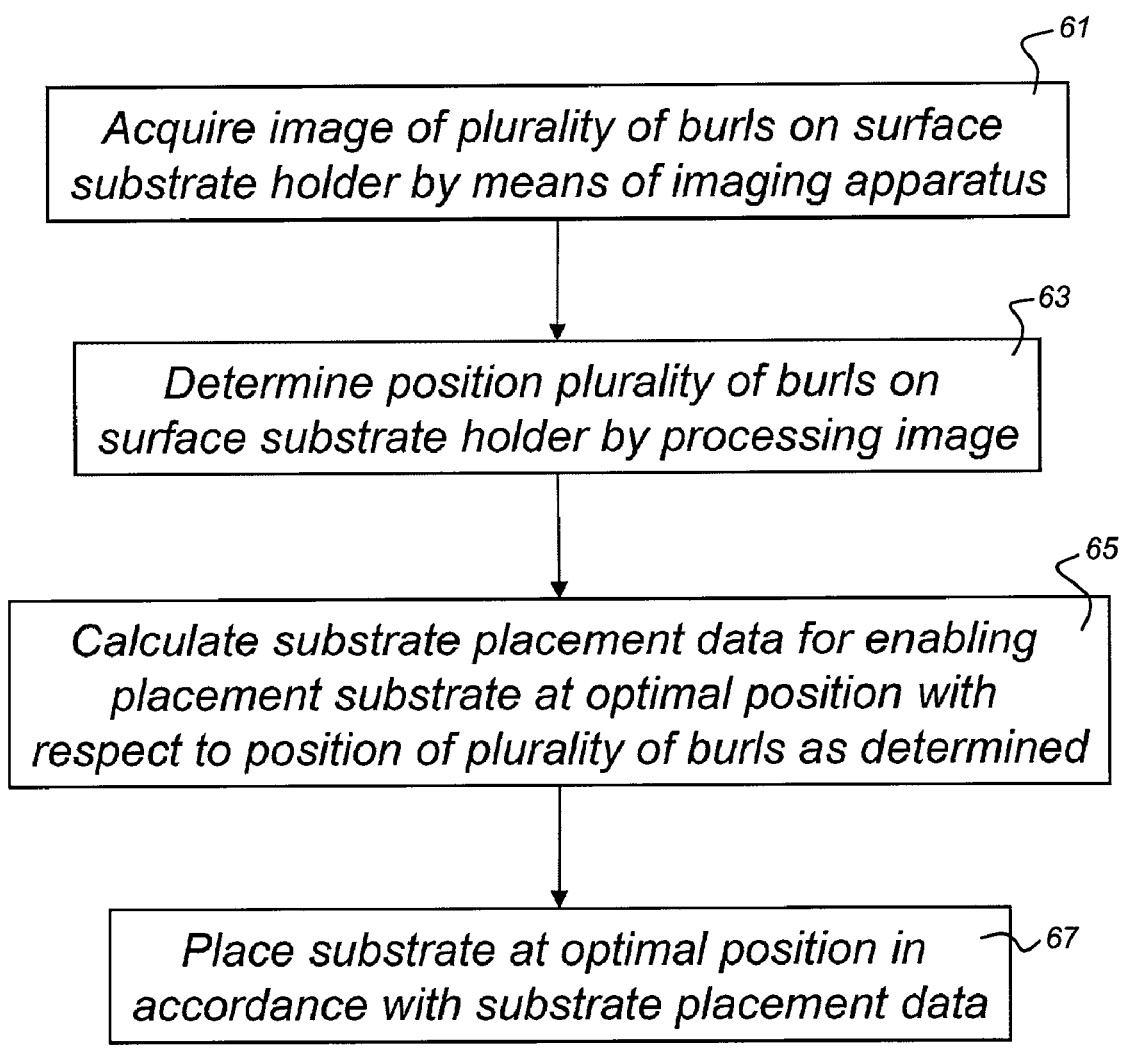
FIG. 4 schematically depicts a flow chart of a method of placing a substrate onto a surface of a substrate holder according to a first embodiment of the invention.

FIG. 4 schematically depicts a flow chart of a method of placing a substrate onto a surface of a substrate holder according to a first embodiment of the invention. First, in action 61, an image of a plurality of burls on a surface of a substrate holder is acquired by means of an imaging apparatus. In case a transfer system as schematically depicted in FIG. 3 is used, the plurality of burls are provided on the second substrate holder 13 and the imaging apparatus corresponds to measurement unit 23.

Subsequently, in action 63, the position of the plurality of burls on the surface of the substrate holder is determined by processing of the image. This processing is performed by a processor. In case a transfer system as schematically depicted in FIG. 3 is used, the processor corresponds to processor 25. In an embodiment, the processing of the image involves the use of a pattern recognition technique.

Then, in action 65, the substrate placement data for enabling placement of the substrate at an optimal position with respect to the position of the plurality of burls as determined is calculated by the processor.

Finally, in action 67, the substrate is placed at aforementioned optimal position in accordance with the substrate placement data as calculated.

Figure 5:
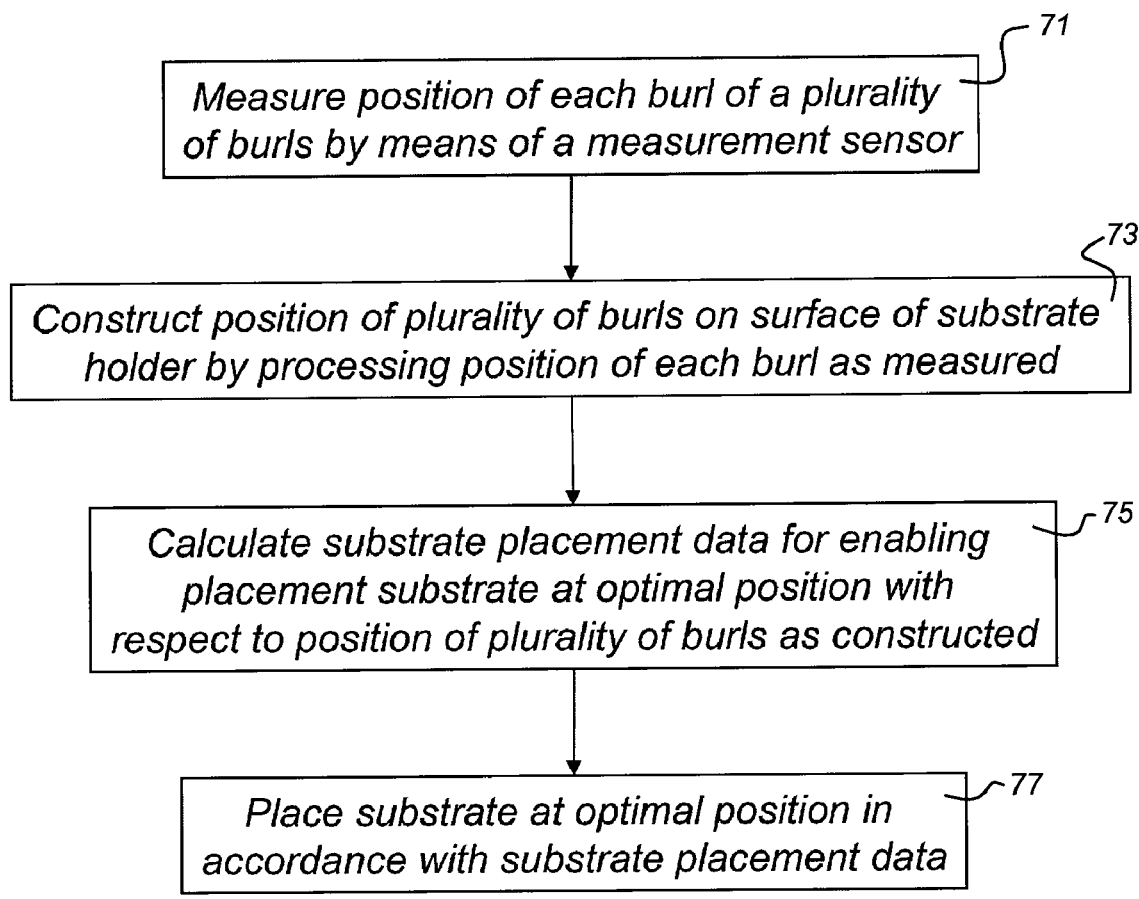
FIG. 5 schematically depicts a flow chart of a method of placing a substrate onto a surface of a substrate holder according to a second embodiment of the invention.

FIG. 5 schematically depicts a flow chart of a method of placing a substrate onto a surface of a substrate holder according to a second embodiment of the invention. In this embodiment, in action 71, first, the position of each burl of a plurality of burls provided on a surface of a substrate holder is measured by means of a measurement sensor. In case a transfer system is used as schematically shown in FIG. 3, the measurement sensor corresponds with measurement unit 23 and the substrate holder corresponds with the second substrate holder 13.

Subsequently, in action 73, the position of the plurality of burls on the surface of the substrate holder by processing the position of each burl as measured. The construction by processing is performed by a processor. In case a transfer system is used as schematically depicted in FIG. 3, the processor corresponds with processor 25.

Then, in action 75, again substrate placement data are calculated for enabling placement of the substrate at an optimal position with respect to the position of the plurality of burls as constructed.

Finally, in action 77, the substrate is placed at aforementioned optimal position in accordance with the substrate placement data as calculated.

Figure 6:
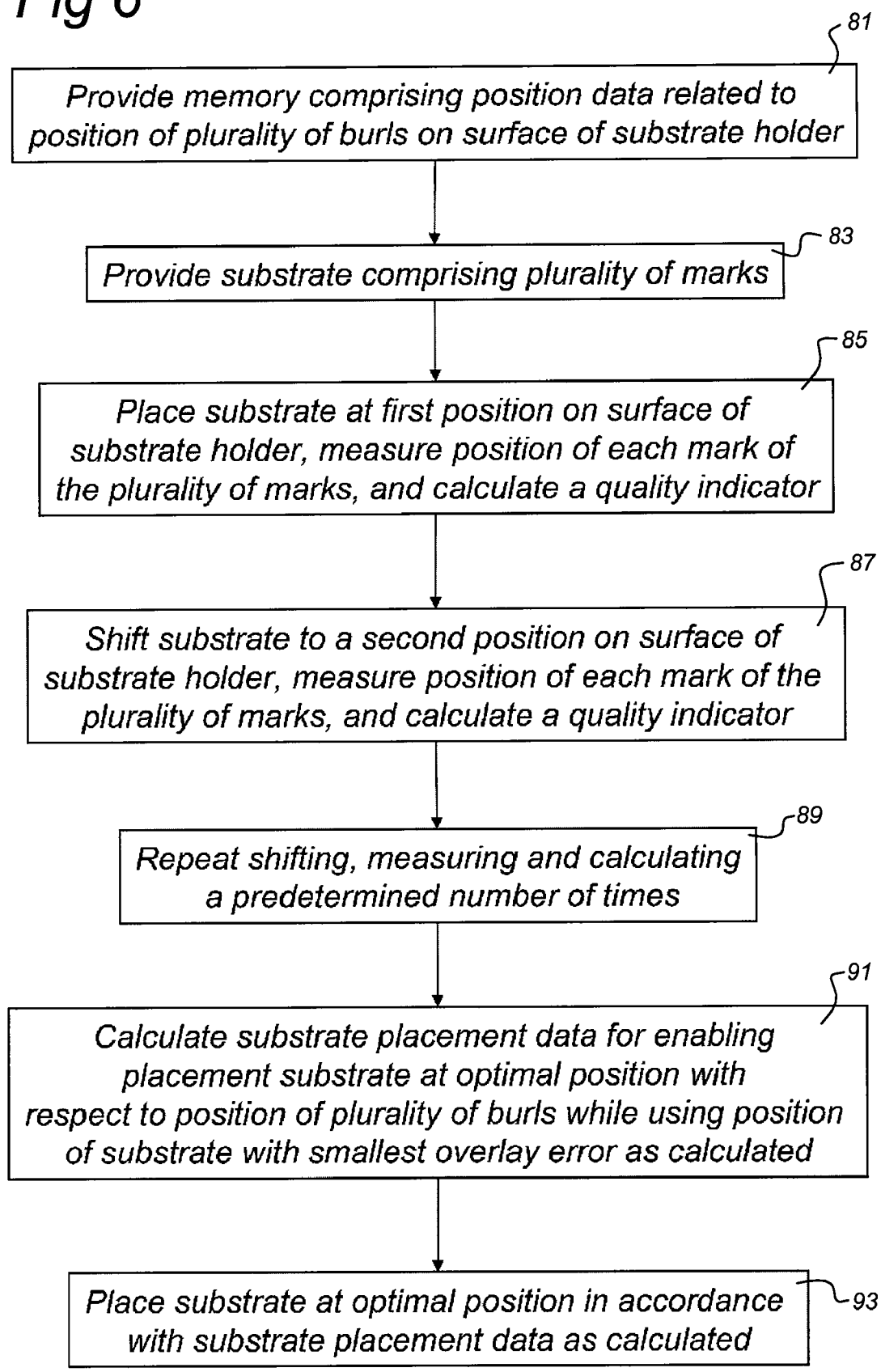
FIG. 6 schematically depicts a flow chart of a method of placing a substrate onto a surface of a substrate holder according to a third embodiment of the invention.

FIG. 6 schematically depicts a flow chart of a method of placing a substrate onto a surface of a substrate holder according to a third embodiment of the invention. First, in action 81, a memory is provided. The memory comprises position data related to a position of a plurality of burls on a surface of a substrate holder. In case a transfer system is used as schematically depicted in FIG. 3, the memory corresponds to memory 27.

Additionally, in action 83, a substrate is provided. The substrate comprises a plurality of marks.

Subsequently, in action 85, the substrate is placed at a first position on the surface of the substrate holder, the position of each mark of the plurality of marks is measured, and a quality indicator is calculated. The quality indicator is a numerical value representing the quality of a certain position, i.e., a measure for an overlay error or a measure for the average amount of deformation taking place at that certain position.

Figure 7A:
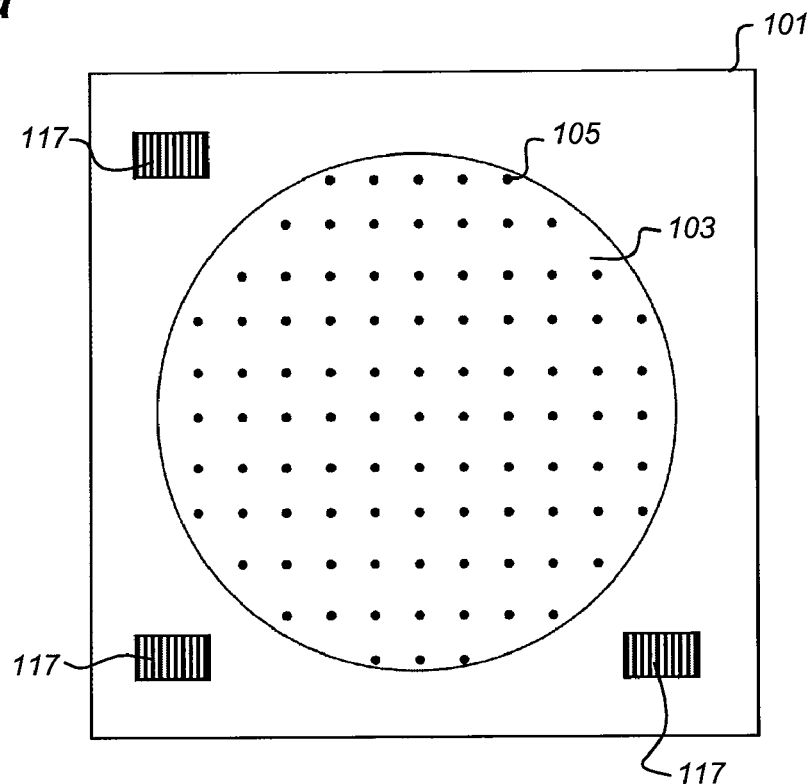
FIG. 7a schematically depicts a top view of a substrate holder comprising a surface provided with a plurality of burls.
Figure 7B:
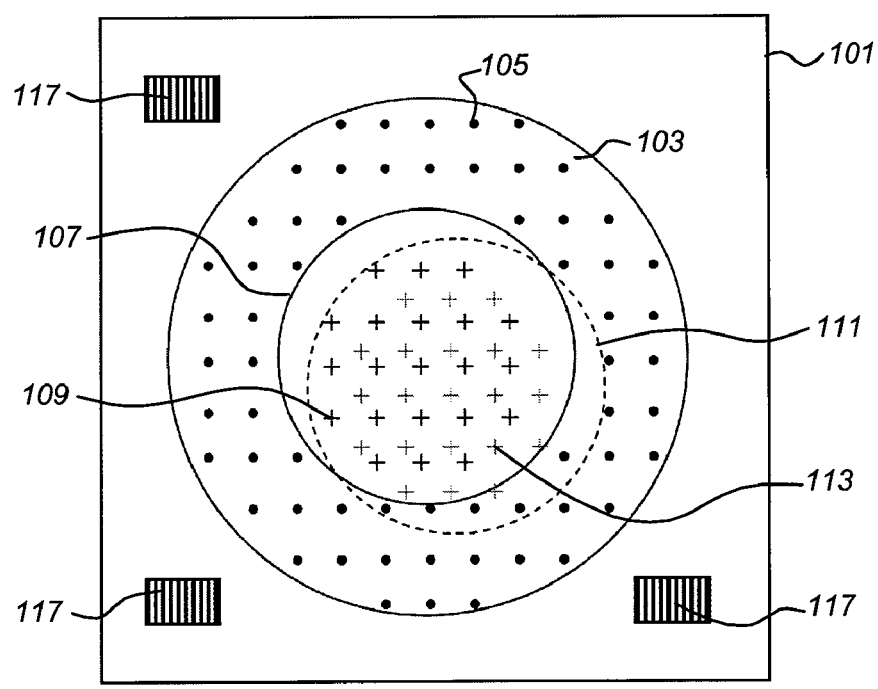
FIG. 7b schematically depicts a top view of the substrate holder of FIG. 7a on top of which a substrate is placed.

In FIG. 7a, a top view of a substrate holder 101 comprising a surface 103 provided with a plurality of burls 105 is schematically depicted. In FIG. 7b, a top view is schematically depicted of a substrate 107, 111 comprising a plurality of marks 109, 113.

In FIG. 6, then, in action 87, the substrate is shifted to a second position on the surface of the substrate holder. The position of each mark of the plurality of marks is measured at this second position and a quality indicator is calculated. The shifting, measuring and calculating is performed a predetermined number of times, represented by action 89. Actions 85 and 87 considering that the predetermined number of times of action 89 equals zero, is schematically depicted in FIG. 7b. The substrate 107, 111 in FIG. 7b is placed at two different positions on the substrate holder 101 of FIG. 7a. In one position, e.g., the first position, the circumference of the substrate 107 is presented in a solid form, while the substrate 111 with dashed circumference shows the substrate at another position, e.g., the second position. The plurality of marks 113 at the latter position are depicted vaguely compared to the plurality of marks 109 on the substrate 107 in the "solid-circumference" position.

Subsequently, in action 91, substrate placement data are calculated. They are calculated by the processor. The substrate placement data enable placement of the substrate at an optimal position with respect to the position of the plurality of burls. In the process of calculating the substrate placement data, the position of the substrate with the smallest overlay error as calculated is used.

Finally, in action 93, the substrate is placed at aforementioned optimal position in accordance with the substrate placement data as calculated.

Figure 8:
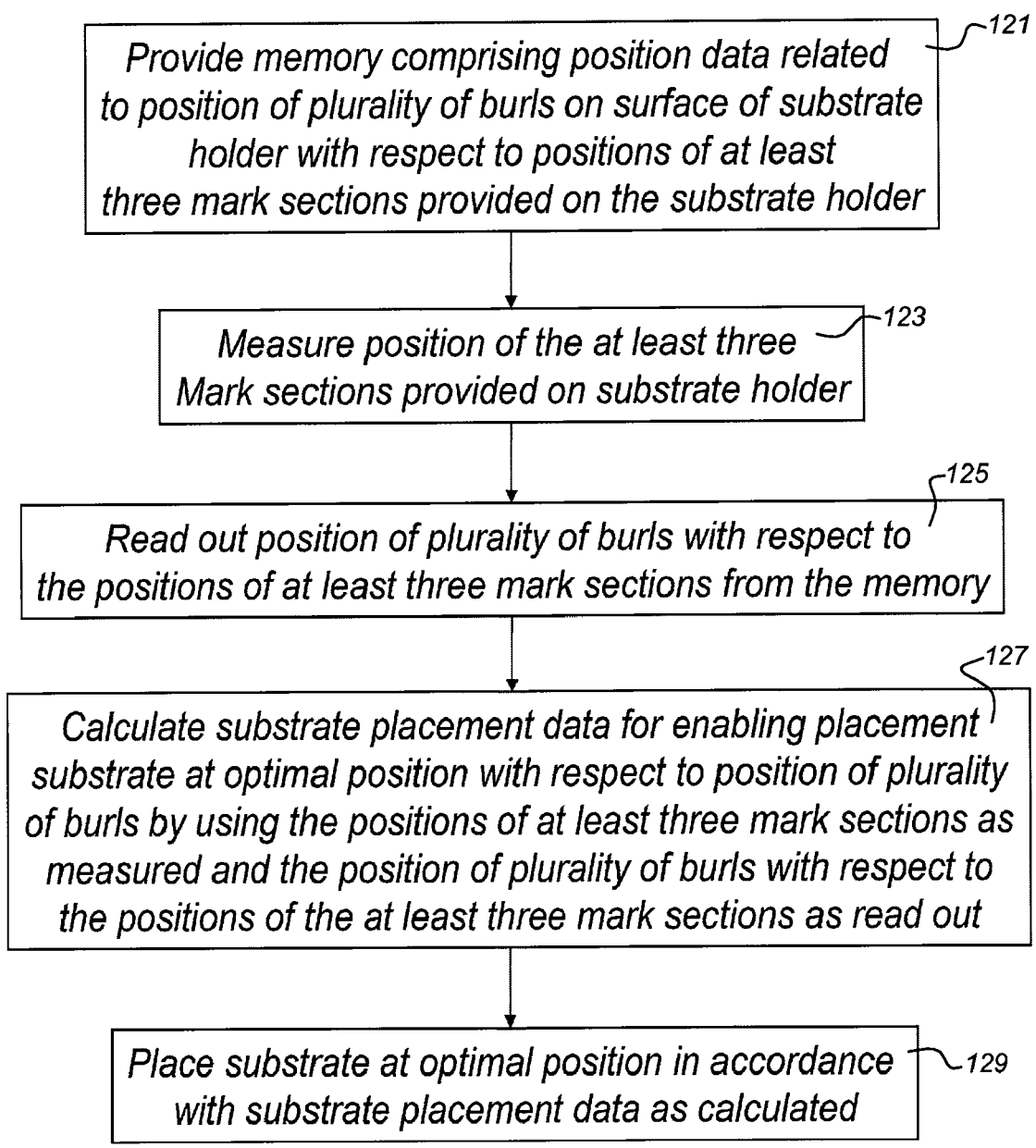
FIG. 8 schematically depicts a flow chart of a method of placing a substrate onto a surface of a substrate holder according to a fourth embodiment of the invention.

FIG. 8 schematically depicts a flow chart of a method of placing a substrate onto a surface of a substrate holder according to a fourth embodiment of the invention. First, in action 121, a memory is provided. In case a transfer system is used as schematically depicted in FIG. 3, the memory corresponds to memory 27. The memory comprises position data related to the position of a plurality of burls on a surface of a substrate holder with respect to positions of at least three mark sections, provided on the substrate holder, i.e. at least three marks in case all marks provide information with respect to one direction, e.g. X-direction or Y-direction) or two marks in case one of the marks provides information with respect to one direction, e.g. X-direction or Y-direction, and a direction substantially perpendicular thereto, e.g. in case of aforementioned direction Y-direction or X-direction respectively. It should be understood that the term mark section does not necessarily relate to a section of a mark, but may also relate to other elements that may serve as some kind of reference, e.g. a reference burl which is not in contact with the substrate or some kind of seal.

With reference to FIGS. 7a and 7b, three marks 117 are provided, which three marks 117 have a known relationship with the plurality of burls 105 present on a surface 103 of the substrate holder 101.

Subsequently, in action 123, the position of the at least three mark sections that are provided on the substrate holder is measured. The measurement may be performed by any suitable measurement unit. In case a transfer system is used as schematically depicted in FIG. 3, the measurement unit corresponds with measurement unit 23. Additionally, in action 125, the position of the plurality of burls with respect to the position of the at least three mark sections on the respective substrate holder is read out from the memory. The data related to this relative position of the at least three mark sections is provided to a processor. In case a transfer system is used as schematically depicted in FIG. 3, the processor corresponds with processor 25. Furthermore measurement data obtained by the measurement unit is also provided to the processor.

Subsequently, in action 127, substrate placement data are calculated by the processor. The substrate placement data enable placement of the substrate at an optimal position with respect to the position of the plurality of burls. In the calculation performed by the processor, the positions of the at least three mark sections as measured and the position of the plurality of burls with respect to the positions of the at least three mark sections as read out are used.

Finally, in action 129, the substrate is placed at an optimal position in accordance with the substrate placement data as calculated.

Figure 9:
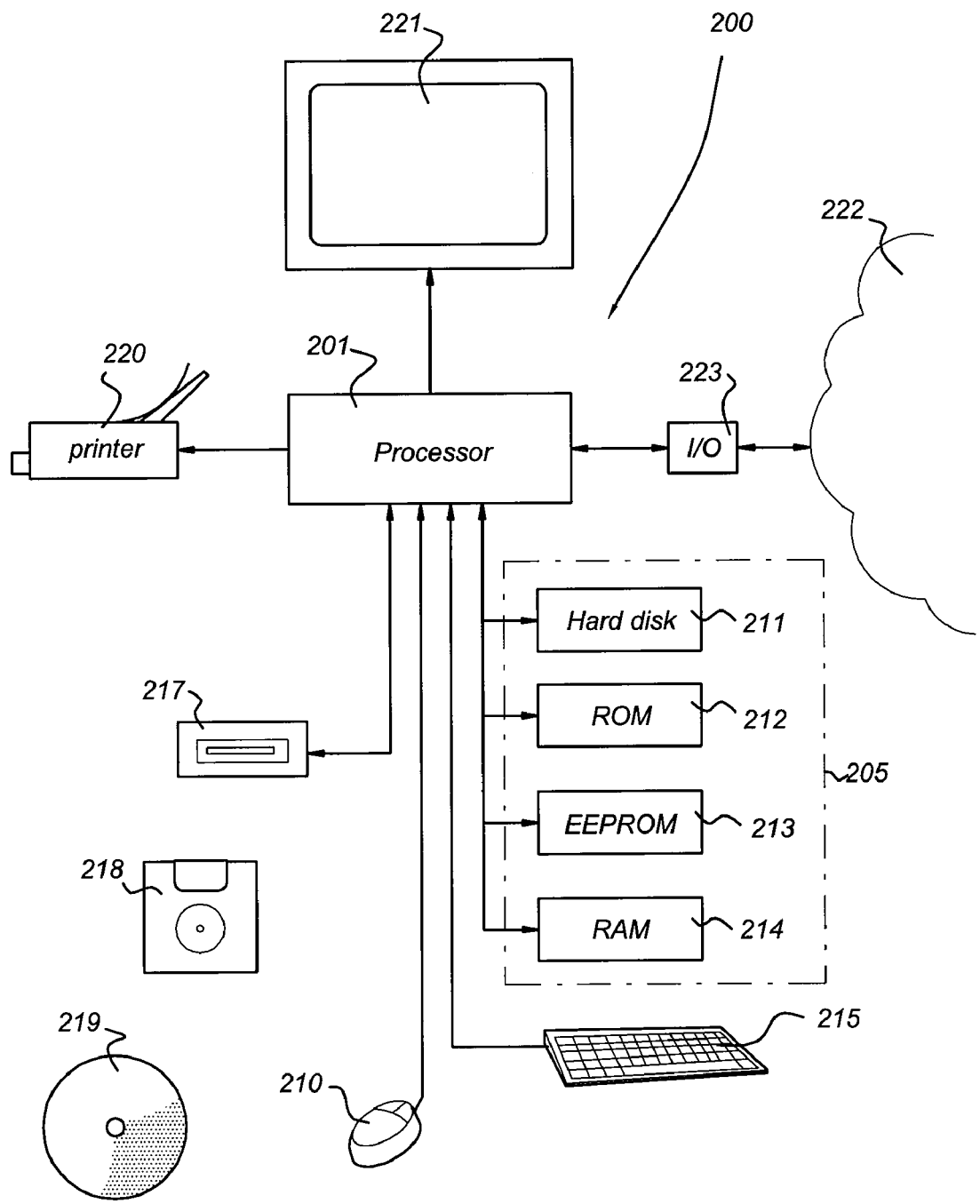
FIG. 9 schematically depicts an embodiment of a computer assembly that may be used in embodiments of the present invention.

FIG. 9 schematically depicts an embodiment of a computer assembly that may be used in embodiments of the present invention. Such a computer assembly 200 may be a dedicated computer in the form of a control unit, e.g., control unit 29. The computer assembly 200 may be arranged for loading a computer readable medium comprising computer executable code. This may enable the computer assembly 200 to execute, when the computer executable code on the computer readable medium is loaded, embodiments of aforementioned method of transferring a substrate from a first substrate holder to a second substrate holder by means of a transfer unit on the basis of transfer data available thereto Additionally or alternatively, this may enable the computer assembly 200 to execute, when the computer readable medium is loaded, a device manufacturing method in which a target portion of a substrate is patterned by means of embodiments of a lithographic projection apparatus comprising such a transfer system.

The computer assembly 200 comprises a processor 201, e.g. processor 25 in communication with control unit 29, and a may further comprise a memory 205, e.g. memory 27 connected to processor 25. The memory 205, which is connected to processor 201, may comprise a number of memory components like a hard disk 211, Read Only Memory (ROM) 212, Electrically Erasable Programmable Read Only Memory (EEPROM) 213 en Random Access Memory (RAM) 214. Not all aforementioned memory components need to be present. Furthermore, it is not essential that aforementioned memory components are physically in close proximity to the processor 201 or to each other. They may be located at a distance away The processor 201 may also be connected to some kind of user interface, for instance a keyboard 215 or a mouse 210. A touch screen, track ball, speech converter or other interfaces that are known to persons skilled in the art may also be used.

The processor 201 may be connected to a reading unit 217, which is arranged to read data, e.g. in the form of computer executable code, from and under some circumstances store data on a computer readable medium, like a floppy disc 218 or a CDROM 219. Also DVD's or other computer readable media known to persons skilled in the art may be used.

The processor 201 may also be connected to a printer 220 to print out output data on paper as well as to a display 221, for example a monitor or LCD (Liquid Crystal Display), of any other type of display known to a person skilled in the art.

The processor 201 may be connected to a communications network 222, for instance a public switched telephone network (PSTN), a local area network (LAN), a wide area network (WAN) etc. by means of transmitters/receivers responsible for input/output (I/O) 223. The processor 201 may be arranged to communicate with other communication systems via the communications network 222. In an embodiment of the invention external computers (not shown), for instance personal computers of operators, can log into the processor 201 via the communications network 222.

The processor 201 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 201 may even be located a distance away of the other processing units and communicate via communications network 222.

In another embodiment the position of the burls is determined using actual height measurement data of a wafer W loaded on a substrate support 13. The lithographic apparatus according to FIG. 3 can perform a height measurement using a known technique of a Wafer W loaded on the support. According to this embodiment a height measurement is performed for at least one line of points on the wafer surface. Preferably a straight line of points is used, in particular in relation to an overlay measurement, which will be further described hereunder. In a further preferred embodiment a straight line of measurement point is used parallel with the X- and/or Y-direction of the lithographic apparatus. The X- and Y-directions are parallel to the long-stroke 31 and short stroke 33 stage modules according to FIG. 3. In another embodiment an Arc of positions is chosen for measuring height data. The arc is preferably parallel with the position of the burls. Since the burls are preferably positioned circumferential around a centre, the arc preferably follows this circle.

Figure 10:
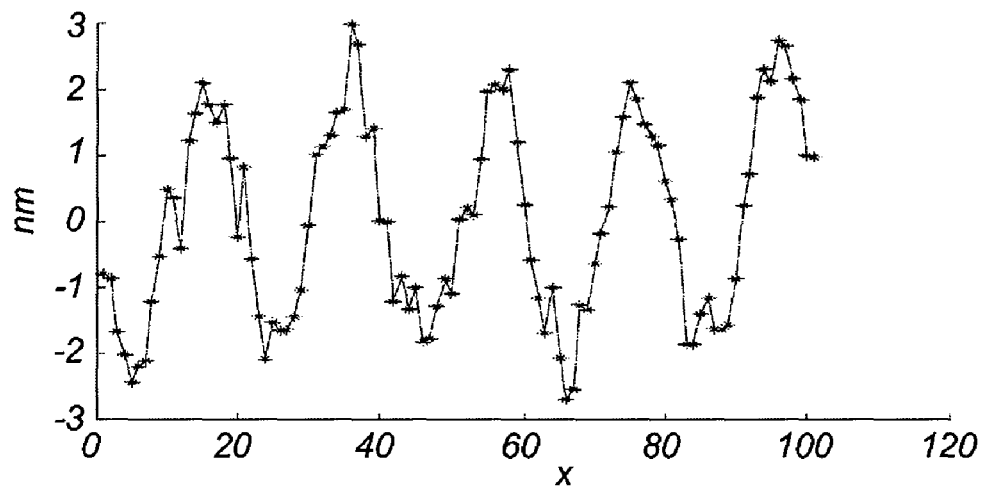
FIG. 10 schematically depicts a height measurement data of a wafer positioned on a substrate table.

FIG. 10 shows an example of measurement data for several measurement points or markers (x-axis) and the relative height of the wafer at these markers. Here x is an indication for a row of marks along an x-axis.

Generally the burls are equally spaced in many parts of a wafer table design. These equally spaced burls will result in a periodically signal in the height data. In an embodiment of the invention a discrete Fourier transform is used to allow obtaining the phase of the periodical signal. This phase can then be used to determine the position of the table. Determining the position of the table will results in being able to calibrate the position of the table during subsequent loadings of wafers.

Figure 11:
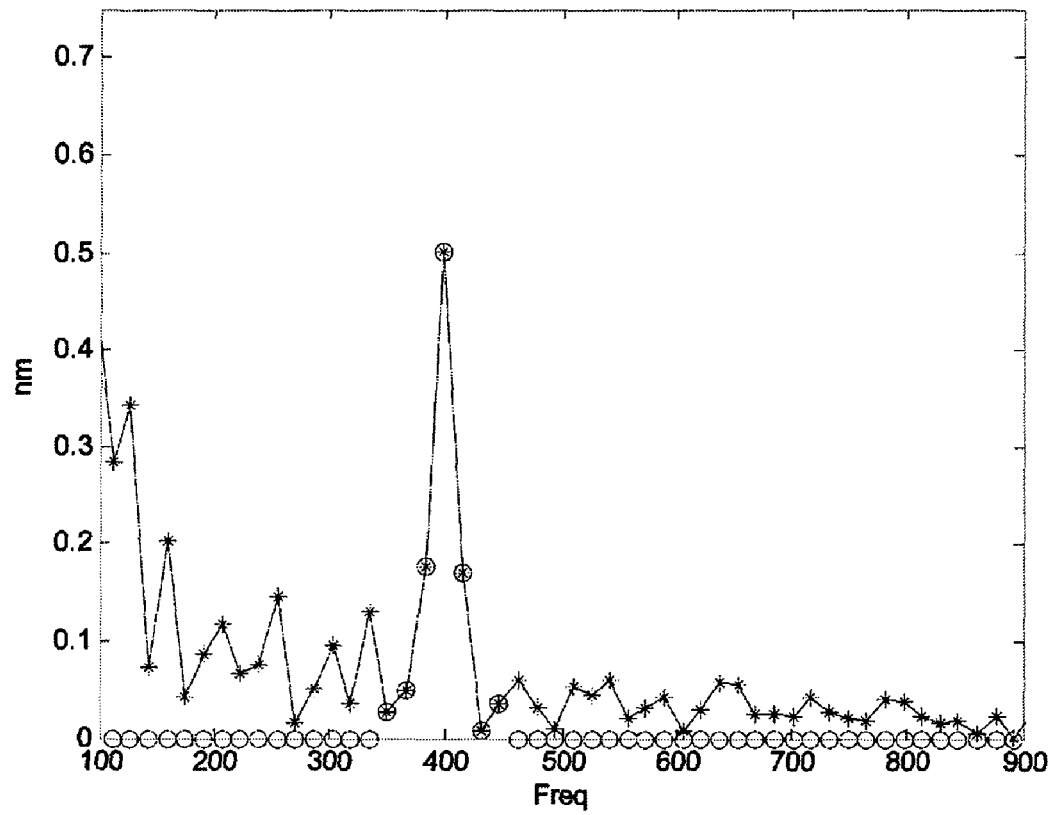
FIG. 11 schematically depicts a discrete Fourier transform of the data according to FIG. 10.

FIG. 11 shows the results of the data according to FIG. 10 after Fourier transform. Much of the noise is eliminated and a sharp peak remains, which is used to determine the phase of the signal. This phase is then used to determine the position of the burls and the position of the table.

In FIG. 11 a frequency maximum of 400 is detected, corresponding with a burl frequency of about 2.5 mm.

In an embodiment the calibration measurement of the wafer positioned on the wafer table is performed using a more flexible wafer than normal. In a preferred measurement the more flexible wafer table in combination with the height measurement. The increased flexibility of the wafer will increase the signal/noise ratio.

In a further embodiment the periodic signal similar to FIG. 10 is determined by performing overlay measurements. In this embodiment a wafer is used with a number of lines with (densely) equally spaced markers. In this embodiment the wafer is loaded onto the substrate support and markers are measured that are in a line in a first direction, preferably a X-direction. Then the wafer is reloaded positioned with a shift in a first direction, preferably X-direction. The shift is preferably equal to half the spacing between burls as determined in the first position. Subsequent the marks are measured again. The difference in positions creates a periodical signal. For Y a similar measurement is done by now with a shift in Y direction.

In an embodiment the bending of the wafer is influenced. The bending can be reduced by lowering the clamping pressure. Such an action can be used instead of repositioning during overlay measurements.

Figure 12:
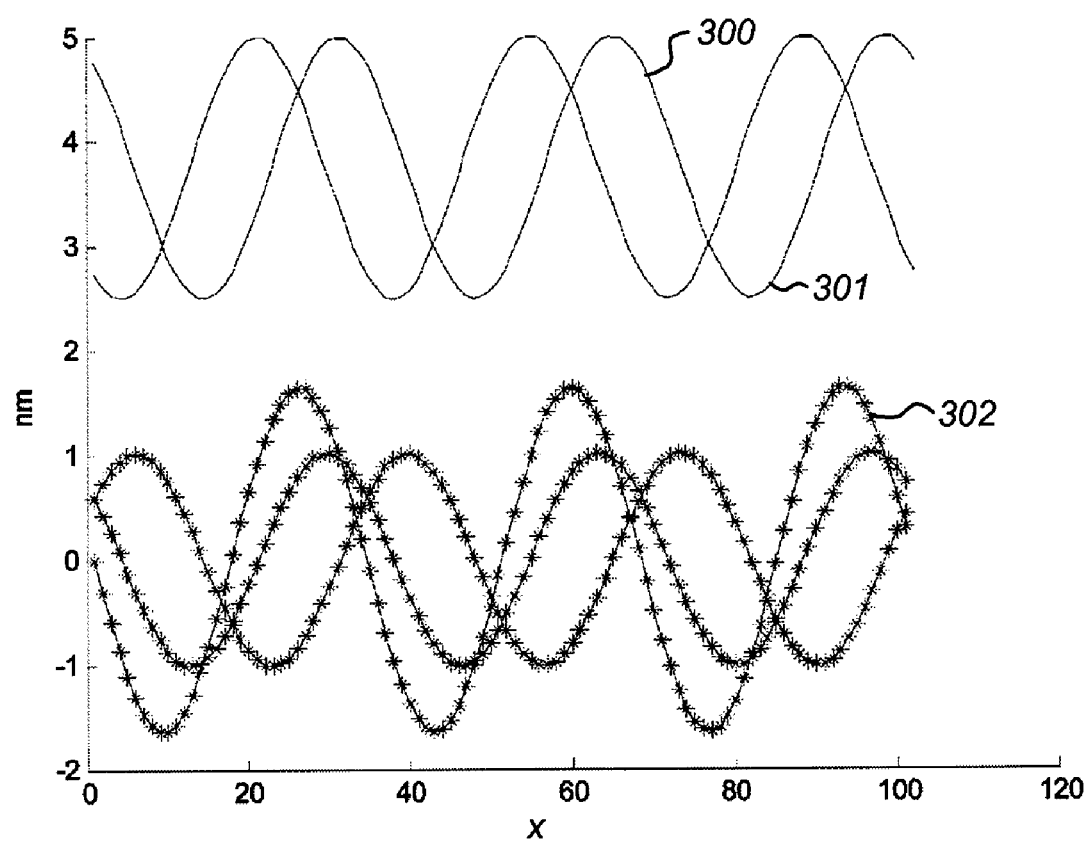
FIG. 12 depicts a simulated overlay error of an embodiment for determining the position of the burls.

The overlay measurements will have a periodic signal. In the embodiment using repositioning, the signal will show a periodic displacement. Such a first and second measurement are simulated and the respective data are shown in FIG. 12. Line 300 is a simulated bending at a first position and line 301 is a simulated bending with the wafer at a second position. In this example the shift in position is about equal to 0.3 the burl distance.

Using a frequency analysis, such as a discrete Fourier transform, will allow to determine the burl frequency, similar to determining the burl frequency in the height data. Frequency analysis has a good signal/noise ratio. The burl position can be obtained from overlay signal 302 which is the difference between the data 300 and 301. The position of the burls can be obtained from the overlay signal 302 in a number of ways, possibly depending on the signs and direction of shift between the first and second position, using the maximum and minimum values of the difference signal.

Surprisingly it was found that the bending of the wafer between the burls shows similarities with a fourth order polynomial. Such a function can be described using harmonic functions, possibly a combination of harmonic functions. Discrete Fourier transform is a possible tool in determining the frequency of the main harmonic function describing the bending of the wafer and additionally the position of the burls.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled person will appreciate that, in the context of such alternative applications, any use of the terms "wafer" or "die" herein may be considered as synonymous with the more general terms "substrate" and "target portion", respectively. The substrate referred to herein may be processed before or after exposure, in for example a track (a tool that typically applies a layer of resist to a substrate and develops the exposed resist), a metrology tool and/or an inspection tool. where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of placing a substrate onto a surface of a substrate holder, said surface being provided with a plurality of burls, the method comprising:
    acquiring a position of said plurality of burls;
    determining, by a processor, substrate placement data for enabling placement of said substrate at a certain position with respect to a position of said plurality of burls on the surface of said substrate holder, wherein said determining substrate placement data comprises:
        measuring a position of each of said plurality of burls by means of a measurement sensor;
        constructing the position of said plurality of burls on the surface of said substrate holder by processing the position of each of said plurality of burls as measured; and
        calculating substrate placement data for enabling placement of said substrate at a certain position with respect to the position of said plurality of burls as constructed; and
    placing said substrate at said certain position in accordance with said substrate placement data.

2. The method according to claim 1, wherein said certain position is the position at which placement of the substrate would result in a minimized overlay error.

3. The method according to claim 1, wherein said certain position is the position at which placement of the substrate would result in minimized substrate deformation.

4. The method according to claim 3, wherein said minimized substrate deformation is determined by one of minimization of a 99.7% interval, minimization of least squares and minimization of average local deformation.

5. A non-transitory computer readable medium comprising computer executable code, which, when loaded on a computer assembly, enables the computer assembly to control the method of placing according to claim 1.

6. A method of transferring a substrate from a first substrate holder to a second substrate holder by means of a transfer unit on the basis of transfer data available thereto, the second substrate holder comprising a surface provided with a plurality of burls, the method comprising:
    providing said substrate on said first substrate holder;
    transferring the substrate by means of said transfer unit in accordance with said transfer data from the first substrate holder to a certain position with respect to the plurality of burls on said second substrate holder; and
    placing said substrate at said certain position on said second substrate holder;
    wherein said placing is performed according to the method of placing a substrate onto a surface of a substrate holder of claim 1.

7. A non-transitory computer readable medium comprising computer executable code, which, when loaded on a computer assembly, enables the computer assembly to control the method of transferring according to claim 6.

8. A method of placing a substrate onto a surface of a substrate holder, said surface being provided with a plurality of burls, the method comprising:
    acquiring a position of said plurality of burls;
    determining, by a processor, substrate placement data for enabling placement of said substrate at a certain position with respect to a position of said plurality of burls on the surface of said substrate holder, wherein said determining substrate placement data comprises:
        providing a memory comprising position data related to the position of said plurality of burls;
        providing a substrate comprising a plurality of marks;
        placing said substrate at a first position on said surface of said substrate holder and measuring the position of each mark of said plurality of marks;
        shifting said substrate to a second position on said surface of said substrate holder and measuring the position of each mark of said plurality of marks;
        repeating said shifting and measuring a predetermined number of times;
        calculating an overlay error for each measurement; and
        calculating substrate placement data for enabling placement of said substrate at a certain position with respect to the position of said plurality of burls while using the position of the substrate with the smallest error as calculated; and
    placing said substrate at said certain position in accordance with said substrate placement data.

9. A method of placing a substrate onto a surface of a substrate holder, said surface being provided with a plurality of burls, the method comprising:
    acquiring a position of said plurality of burls;

determining, by a processor, substrate placement data for enabling placement of said substrate at a certain position with resect to a position of said plurality of burls on the surface of said substrate holder, wherein said determining substrate placement data comprises:

providing a memory comprising position data related to the position of said plurality of burls with respect to positions of at least three mark sections provided on said substrate holder;

measuring a position of said at least three mark sections provided on said substrate holder;

reading out the position of said plurality of burls with respect to the positions of said at least three mark sections from said memory; and calculating substrate placement data by using the position of the at least three mark sections as measured and the position of the plurality of burls with respect to the at least three mark sections as read out, said calculating enabling placement of said substrate said certain position with respect to the position of said plurality of burls; and placing said substrate at said certain position in accordance with said substrate placement data.

10. A support system for supporting a substrate, said support system comprising:

a substrate holder configured to hold said substrate, said substrate holder comprising a surface provided with a plurality of burls;

a substrate handling device configured to place a substrate on said substrate holder in accordance with substrate placement data;

a measurement unit configured to perform measurement useable for determining a position of said plurality of burls provided on the surface of said substrate holder, wherein the measurement unit is a measurement sensor configured to measure a position of each of the plurality of burls, and the processor is further configured to construct a position of the plurality of burls by processing the position of each of said plurality of burls as measured and to calculate the substrate placement data; and a processor configured to determine substrate placement data, said substrate placement data enabling placement of said substrate on the surface of said substrate holder at a certain position with respect to the position of said plurality of burls.

11. A support system for supporting a substrate, said support system comprising:

a substrate holder configured to hold said substrate, said substrate holder comprising a surface provided with a plurality of burls;

a substrate handling device configured to place a substrate on said substrate holder in accordance with substrate placement data;

a measurement unit configured to perform measurement useable for determining a position of said plurality of burls provided on the surface of said substrate holder, wherein the substrate holder is provided with at least three mark sections, the support system further comprises a memory connected for communication with said processor, the memory comprising position data related to the position of said plurality of burls with respect to positions of said at least three mark sections, and the measurement unit is configured to measure a position of said at least three mark sections; and a processor configured to determine substrate placement data, said substrate placement data enabling placement of said substrate on the surface of said substrate holder at a certain position with respect to the position of said plurality of burls.

12. A lithographic projection apparatus comprising:

an illumination system configured to provide a beam of radiation;

a support structure configured to support a patterning device that serves to impart said beam of radiation with a pattern in its cross-section;

a support system for supporting a substrate including
a substrate holder configured to hold said substrate, said substrate holder comprising a surface provided with a plurality of burls,
a substrate handling device configured to place a substrate on said substrate holder in accordance with substrate placement data,
a measurement unit configured to perform measurement useable for determining a position of said plurality of burls provided on the surface of said substrate holder, wherein the measurement unit is a measurement sensor configured to measure a position of each of the plurality of burls, and the processor is further configured to construct a position of the plurality of burls by processing the position of each of said plurality of burls as measured and to calculate the substrate placement data,
a processor configured to determine substrate placement data, said substrate placement data enabling placement of said substrate on the surface of said substrate holder at a certain position with respect to the position of said plurality of burls, and a projection system configured to expose said patterned beam on said substrate.

13. A non-transitory computer readable medium comprising computer executable code, which, when loaded on a computer assembly, enables the computer assembly to control a method of placing a substrate onto a surface of a substrate holder, said surface being provided with a plurality of burls, the method comprising:

acquiring a position of said plurality of burls;

determining, by a processor, substrate placement data for enabling placement of said substrate at a certain position with respect to a position of said plurality of burls on the surface of said substrate holder, wherein said determining substrate placement data comprises:

measuring a position of each of said plurality of burls by means of a measurement sensor;

constructing the position of said plurality of burls on the surface of said substrate holder by processing the position of each of said plurality of burls as measured; and calculating substrate placement data for enabling placement of said substrate at a certain position with respect to the position of said plurality of burls as constructed; and placing said substrate at said certain position in accordance with said substrate placement data.

* * * * *